(12) United States Patent
Maxwell

(10) Patent No.: US 7,154,174 B2
(45) Date of Patent: Dec. 26, 2006

(54) POWER SUPPLY PACKAGING SYSTEM

(75) Inventor: John Alan Maxwell, Newbury Park, CA (US)

(73) Assignee: Power-One, Inc., Camarillo, CA (US)

( * ) Notice: Subject to any disclaimer, the term of this patent is extended or adjusted under 35 U.S.C. 154(b) by 0 days.

(21) Appl. No.: 10/925,792

(22) Filed: Aug. 24, 2004

(65) Prior Publication Data
US 2005/0024838 A1    Feb. 3, 2005

Related U.S. Application Data

(63) Continuation-in-part of application No. 10/377,202, filed on Feb. 27, 2003.

(51) Int. Cl.
*H01L 23/10* (2006.01)
*H01L 23/34* (2006.01)

(52) U.S. Cl. ....................... 257/707; 257/691

(58) Field of Classification Search ................ 257/707, 257/706, 735, 778, 784, 786, 691, 698, 659, 257/704, 700; 361/794
See application file for complete search history.

(56) References Cited

U.S. PATENT DOCUMENTS

| | | | | |
|---|---|---|---|---|
| 6,111,322 A | * | 8/2000 | Ando et al. | 257/778 |
| 6,603,154 B1 | * | 8/2003 | Sakai et al. | 257/166 |
| 6,774,466 B1 | * | 8/2004 | Kajiwara et al. | 257/673 |
| 6,867,678 B1 | * | 3/2005 | Yang | 336/200 |
| 6,903,938 B1 | * | 6/2005 | Waffenschmidt | 361/779 |

OTHER PUBLICATIONS

Printed Circuit Board-Answers.com pp. 4-9.*

* cited by examiner

*Primary Examiner*—S. V. Clark
(74) *Attorney, Agent, or Firm*—O'Melveny & Myers LLP

(57) ABSTRACT

A packaging system for a high current, low voltage power supply. The power supply uses bare die power FETs which are directly mounted to a thermally conductive substrate by a solder attachment made to the drain electrode metallization on the back side of the FETs. The source electrode and gate electrode of each FET are coupled to the circuitry on an overhanging printed circuit board, using CSP solder balls affixed to the front side of the FET die. The heat generated by the FETs is effectively dissipated by the close coupling of the FETs to the thermally conductive underlying substrate. High interconnect densities are achieved through the use of a multilayer printed circuit board. This high interconnect density, with the addition of a magnetic core element, allows the power supply packaging system to incorporate transformer windings for an isolation transformer or an inductor.

5 Claims, 5 Drawing Sheets

POWER SUPPLY PACKAGING SYSTEM

RELATED APPLICATION DATA

This application is a continuation-in-part of the U.S. patent application Ser. No. 10/377,202 filed Feb. 27, 2003, currently pending.

BACKGROUND OF THE INVENTION

1. Field of the Invention

The present invention relates to the packaging of semiconductor devices. More particularly, this invention relates to the packaging of power transistors to form a power supply.

2. Description of Related Art

With the advent of microprocessors and other electronics that consume more electrical power, comes the need for higher output power supplies. While microprocessor voltage requirements are decreasing, substantial increases in electric current requirements are offsetting this trend. Future processors may consume current at levels an order of magnitude higher than today's processors, and will dissipate much more power because the operating voltage will not decrease proportionately. GHz class central processing units (CPUs) are routinely specified to draw 30 A or more of direct current. Therefore a need has arisen for high current, low voltage power sources which have a small physical size and generate a modest amount of heat. (As is conventional, "power source" or "power supply" refers here to an electrical voltage/current converter, not to the ultimate source of the electricity, such as a battery or generator.)

Heat sinking is important for the power semiconductor devices which form the primary components of the power supply systems. Power semiconductor devices tend to generate substantial amounts of heat, because they are required to switch large currents. Furthermore, the power semiconductor devices are often deployed in environments that are relatively hot, such as in an engine compartment or in the chassis of a personal computer. The dissipation of heat generated by the power semiconductor devices is accomplished by, for example, mounting the chip to a thermal heat conducting flange and then mounting the heat conducting flange to a bracket with fins formed therein and exposing the finned structure to a cooling air flow.

However with the miniaturization of electronics products, less room exists within the power supply packages for dissipating the heat generated by the devices. Furthermore, the miniaturization has driven the reduction in size of the integrated circuits (ICs) or discrete semiconductor devices such as transistors (e.g., field effect transistors FETs), and an increase in packing densities of the ICs or FETs on the power supply circuit board. The amount of heat generated per unit area by the reduced footprint (size) ICs or FETs increases with their packing density. The requirements for packaging these heat-generating ICs or FETs in ever smaller areas, make the need to provide adequate heat exhaust paths more urgent, and this is particularly so for high current devices such as power supply modules.

Therefore, because of the continued trend to miniaturize electronic products, the power supplies that power the products are required to become smaller, and particularly to become thinner. The thickness of the power supply may be dictated in part, by the connector pitch on the motherboard, which may be for example 0.6 inches. Therefore, the thickness of the power supply package may be preferably less than 15.24 mm. Because of the small size of the packages, large thermal masses are no longer available to dissipate heat. Furthermore, little space remains between the packages, in which to circulate the cooling fluid such as air.

Therefore a problem remains in the design of high current power supplies, in sourcing and sinking the large currents but keeping the physical size small, the cost low and limiting the temperature rise.

SUMMARY OF THE INVENTION

The present invention is a novel package design for high current power supplies, which improves upon the prior art by providing for an improved heat exhaust path for the high current FET switches, while having a very thin module package. The heat exhaust path is from the drain electrode formed on the back side of the bare FET die directly to a thermally conductive substrate which supports the FET die, as well as other circuit components. The thermally conductive substrate itself forms the outer wall of the power supply package, and therefore takes advantage of the relatively large full package dimension to dissipate heat.

The control gate and input electrodes are formed on the front side of the FET die in a conventional chip scale package (CSP) format, and attached therefrom to a multilayer printed circuit board which is disposed above the thermally conductive substrate. The multilayer printed circuit board therefore forms the other side of the power supply package. The multilayer printed circuit board allows increased circuit density to be achieved by a power supply packaging system of the present invention. The multilayer printed circuit board also promotes ease of handling during manufacture. The FET is mounted in an inverted orientation, wherein the CSP bonding pads are facing upwards, toward the surface of the multilayer printed circuit board (PCB). The current path is therefore through the multilayer PCB, to the FET switch, and to an electrical trace attached to the surface of the thermally conductive substrate. The circuit board therefore delivers the input current and control gate signals to the FET, while a trace on the thermally conductive substrate carries the drain current for the FET.

In a first embodiment of the present invention, the thermally conductive substrate comprises an electrically conductive layer deposited or attached to an electrically insulating layer which covers the thermally conductive substrate. The thermally conductive substrate supports any number of additional electronic devices which comprise the power module, such as controller chips, inductors, resistors and capacitors. For increased interconnect density, the overhanging multilayer printed circuit board may also support components which generate less heat, and therefore do not require the close proximity that the transistors require to the heat exhaust path.

The thermally conductive substrate is a large area thermal mass, which dissipates the heat generated in the body of the FET device. By attaching the FET body directly to the heat sink, the invention avoids the inefficient heat transfer path which afflicts the prior art packaging schemes, in which the heat is conducted out of the semiconductor device through the pins connected to the device. Use of the CSP reduces the volume taken up by the device, and increases the thermal contact between the device and the thermally conductive substrate, by allowing attachment to the bare substrate material of the FET. By using a multilayer circuit board for the top substrate, the interconnect density can remain high, while significant amounts of heat can be exhausted from the package by the thermally conductive bottom substrate.

The packaging approach allows a small size, thin package, with small temperature rise. The lower temperature rise results in less mechanical stressing of the components, and a higher reliability because of reduced thermal cycling.

In a second embodiment of the present invention, an isolation transformer or inductor can be integrated into the completed assembly. In this embodiment, the multilayer printed circuit board contains the primary windings etched within the layers, and the thermally conductive substrate contains secondary turn or turns. The laminate layers and solder mask would provide electrical isolation. A magnetic core element would complete the transformer and could consist of separate E and I cores or pairs of E cores placed through holed in the multilayer printed circuit board. Depending on circuit density and size, most of the circuit elements could be completely enclosed within the magnetic element.

In the exemplary embodiments disclosed herein, the invention is applied to a generic voltage converter which uses high current FETs. However it will be clear to those skilled in the art that the invention can be applied to virtually any circuit using power semiconductor switches or other devices such as bipolar transistors and field effect transistors.

These and other features of the present invention will be illustrated further by the following detailed description, and the accompanying drawings of the exemplary embodiments.

DETAILED DESCRIPTION OF THE PREFERRED EMBODIMENTS

Chip-scale packages (CSPs) have become common in the electronics field, as a result of efforts to minimize the physical size of the component. Chip Scale Packaging is generally defined as a single die package that is no larger than 1.2 times the die size. A CSP is often designed such that the integrated circuit die is attached to its mating surface, generally a printed circuit board, face-down, with the chip pads connecting to the PCB pads through individual balls of solder. The CSP approach to semiconductor packaging takes up a minimal amount of additional volume, by using direct solder ball attachment and leaving some or all surfaces of the bare chip exposed. The principle advantages of the CSP are a reduction in package size and enhanced thermal conduction characteristics, as well as a reduction in the chip-to-PCB inductance.

Alternatively, an FET die with a solderable source electrode can be used with a metallic strap (relatively wide, thick member for low resistance) connecting the FET's source electrode to the PCB.

This invention in one embodiment makes use of a style of CSP in which the solder ball attachment points are formed on the front side of the CSP, and the back side of the CSP is the bare body of the die substrate, which may be metallized for electrical connection. This invention takes advantage of the access available to the bare body of the die in a CSP, by connecting a thermal heat sink and electrical connection directly to the metallized back of the bare FET die. The heat sink, which is a thermally conductive substrate, provides structural support for the FET, as well as other components which may be mounted to the thermally conductive substrate. The thermally conductive substrate therefore forms a part of the overall package, which in addition to the switching transistors, may also contain other circuitry for operating the power supply.

Figure 1:
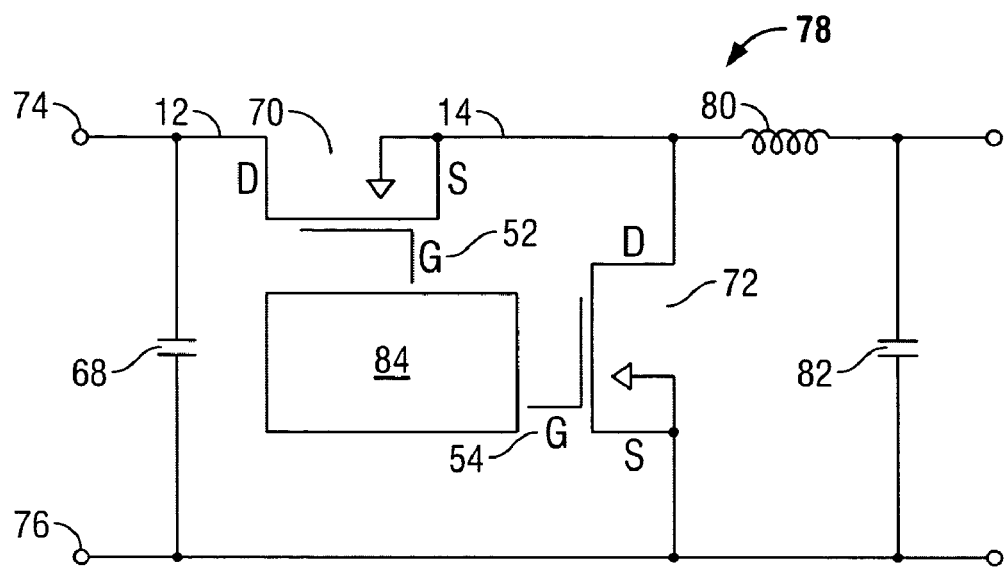
FIG. 1 is a schematic diagram of a buck converter circuit, upon which this invention can be carried out.

FIG. 1 is a simplified schematic diagram of an exemplary circuit upon which this invention may be carried out. FIG. 1 shows a synchronous buck converter, which is a circuit well known in the art, which converts a DC input current and voltage to a different DC output voltage. The synchronous buck converter of FIG. 1, includes two power switches (transistors or FETs) 70, 72 coupled across the input voltage terminal 74, with an input capacitor 68. The power switches are P- or N-channel field effect transistors (FETs), or bipolar transistors, for example. The voltage switch, 70, has its drain terminal (D) coupled to the input terminal 74 by line 12 and the other switch 72 has its drain terminal (D) connected to an inductor 80 by line 14. The FETs used in this embodiment are, for example NA85 FDS6688 for the ground switch 72, and NY85 FDS6694 for the voltage switch 70, which are N-channel enhancement mode FETs manufactured by Fairchild Semiconductor Corp. of South Portland, Me. An output filter 78 typically including the inductor 80 and a capacitor 82, is connected to the node 14 between switches 70, 72. The output filter 78 provides output voltage to a load under the direction of a controller chip 84. The controller 84 controls the switches 70 and 72 via their gate terminals (G) 52 and 54 to connect the output filter 78 to the voltage terminal 74 or to the ground terminal 76, to maintain the output voltage at a predetermined level. In the event that the load output voltage exceeds a reference level, the controller 84 turns off voltage switch 70, and turns on grounded switch 72, allowing inductor 80 to discharge. When the voltage drops to a level below the reference voltage, the controller turns on voltage switch 70 and turns off grounded switch 72, thereby charging inductor 80 and providing current to the output load. This maintains continuous power delivery during the on and off states of switch 70.

The synchronous buck converter of FIG. 1 may be used to generate 40 A to 60 A or more of output current at 0.6V to 3.3V DC output voltage, depending on the components used.

To implement this invention on the circuit shown in FIG. 1, a thermally conductive substrate 42 is provided which supports the drain contacts 12 and 14 for the transistors 70 and 72. The structure of the thermally conductive substrate 42 is shown in greater detail in FIG. 2. The substrate 42 has electrically conductive traces 12, 14 attached to an electrically insulating layer 40. The insulating layer 40 can be a thin layer of glass/epoxy, or Thermagon, which is a ceramic-filled epoxy polymer, thermally conductive material for printed circuit board design applications, manufactured by Thermagon Inc. of Cleveland Ohio. Alternatively, the insulating layer can be bismaleimide triazine (BT). The insulating layer 40 is applied over the surface of the thermally conductive material 44. The purpose of the insulating layer is to isolate the electrical connections between the various devices which may be mounted upon the thermally conductive substrate 42. The thickness of the insulating layer may be, for example, about 50 μm to 300 μm thick. The thermally conductive material 44 serves as the heat sink, and can be aluminum, copper or ceramic, or any other material with suitable thermal properties. Suitable ceramic materials can include aluminum nitride, boron nitride, and alumina $Al_2O_3$. The term "thermally conductive substrate" 42, refers to the combination of the thermally conductive material, 44, with the thermally conductive, electrically insulating layer 40, and electrically conductive traces 12 and 14.

The FETs 70, 72 are attached to the conductive traces 12, and 14 by conductive epoxy or solder 34, 35 which is applied to the drain electrode metallization formed on the back side of the bare die FET 70, 72. The solder may be eutectic solder such as 37% Pb and 63% Sn. Suitable conductive adhesives are manufactured by Ablestick Corporation of Seoul, Korea, for example. Ablestick manufactures a variety of die attach and microcircuit adhesives, such as Ablestick 84-1LMI which may be used in this application. Acceptable solder compounds are manufactured by Cooper Industries of Houston, Tex., Indium Corporation of Utica, N.Y., and Kester, a business unit of Northrop Grumman in Des Plaines, Ill.

The thermal path between the heat generating device and the heat sink is thereby nearly as short as possible, through only a 25 μm thin layer of conductive adhesive 34, 35 to conductive layers 12 and 14, through the 50 μm to 300 μm thick insulating layer 40, to the thermally conductive substrate material 44, with no wires or wire bonds to constrict the flow of heat. The dimensions of the thermally conductive material 44 may be determined by its heat transfer requirements, but it is for example, 750 μm to 1.5 mm thick. The invention may be applied to each of the heat-generating devices in the power circuit such as FETs 70 and 72 included in FIG. 1, according to FIG. 2.

Figure 2:
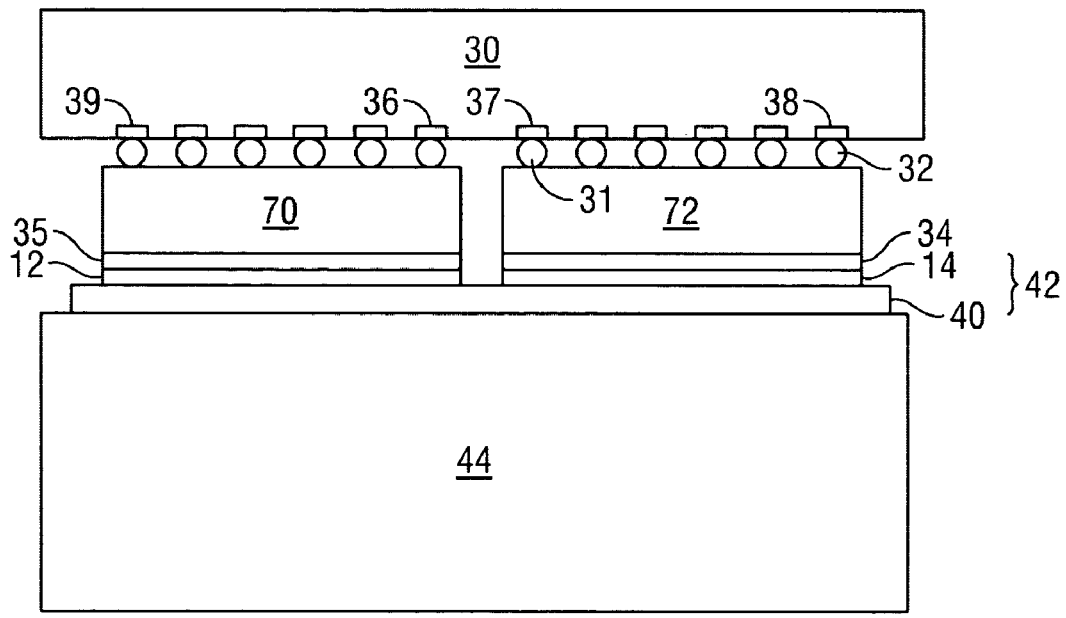
FIG. 2 shows a cross sectional view of the multilayer printed circuit board and the thermally conductive substrate, with the FETs disposed in between the multilayer printed circuit board and the thermally conductive substrate.

The additional electrical connections required for the FETs 70 and 72 are provided by conductive traces 36, 37, 38, 39 on the multilayer printed circuit board 30 (PCB). Respective source and gate signal contacts 37 and 38, for example, are located on the multilayer PCB and electrically coupled to respective source and gate terminals on the transistor die 72, via the front side solder ball attachments 31, 32. FET 72 is attached to the multilayer PCB, by inverting the FET die and soldering its CSP solder balls to the overhanging printed circuit board as indicated in FIG. 2. Typically, the plurality of solder ball attachments is connected to a single conductive pad on the multilayer PCB, although the pads are shown as being electrically isolated in FIG. 2. One of the solder ball attachments, for example, attachment 32, corresponds to the gate electrode for the FET device, and so is connected singly to the gate electrode trace 38 on the multilayer PCB. The signal on the gate electrode trace 38 is generated by the controller chip 84, mounted on the thermally conductive substrate.

Figure 3:
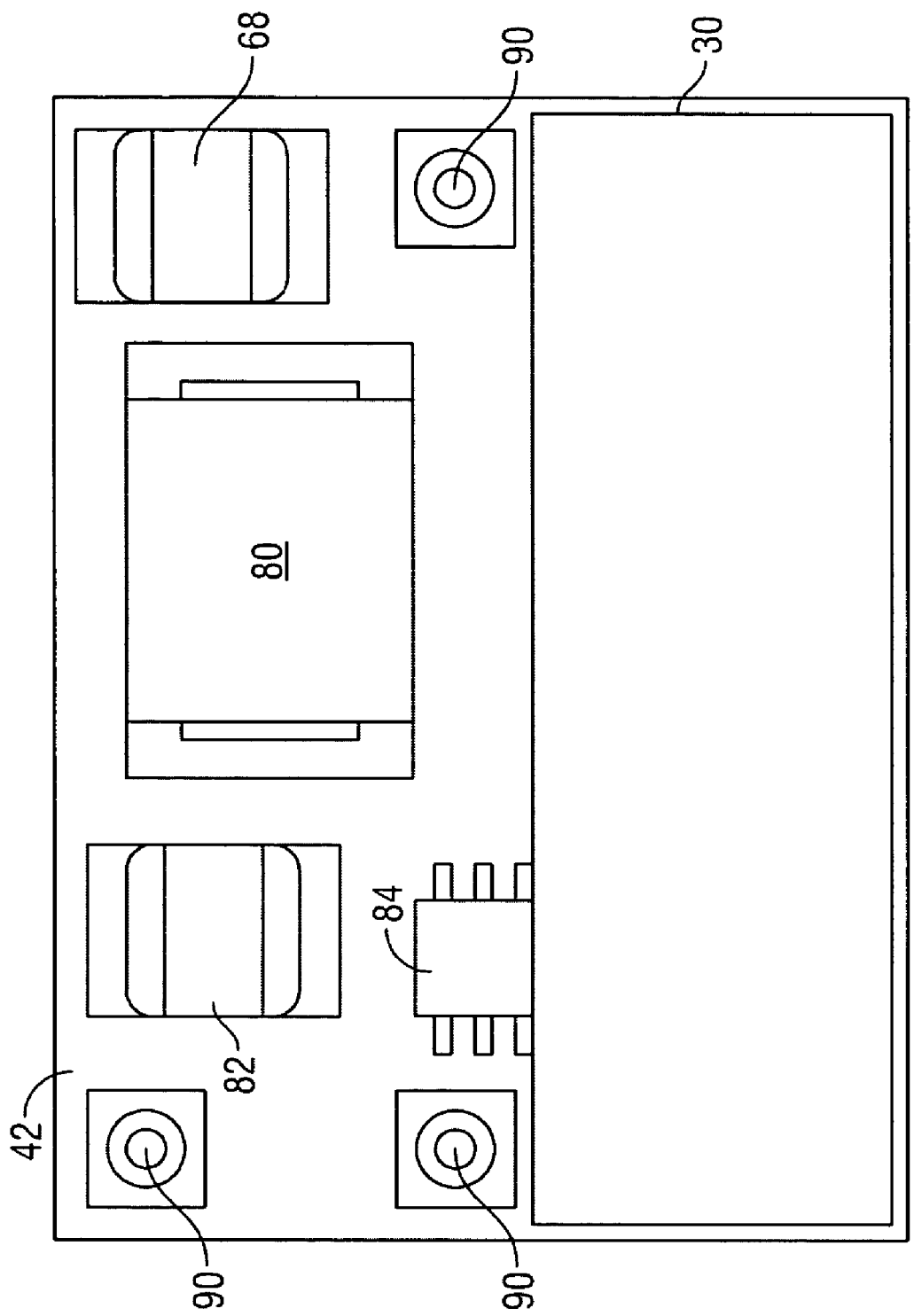
FIG. 3 is a top view of the multilayer printed circuit board and thermally conductive substrate assembly.

In addition, the thermally conductive substrate can accommodate other devices in the power circuit shown in FIG. 1, such as capacitors 68 and 82, and inductor 80 and other components which operate the FET switches. These additional devices are shown in FIG. 3, which is a top view of the multilayer printed circuit board 30 and thermally conductive substrate 42 assembly. As shown in FIG. 3, in this embodiment, the multilayer printed circuit board 30 covers only that portion of the thermally conductive substrate 42 which holds the FET switches. Other areas which hold, for example the inductor and capacitors, are not covered by the multilayer PCB 30, in order to reduce the thickness of the assembly in these areas.

The multilayer printed circuit board may be populated with devices on the top layer, the bottom layer, and on two inner layers of the multilayer PCB 30. The multilayer printed circuit board 30 thereby increases the interconnect density of the power module.

Figure 4:
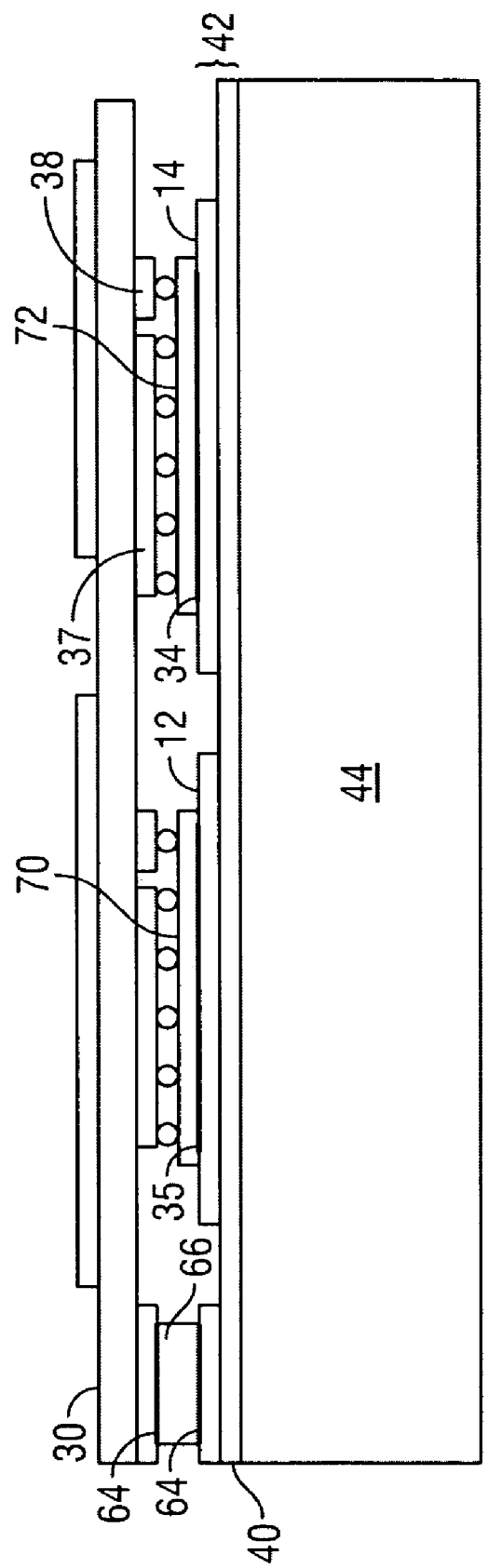
FIG. 4 is a side view of the multilayer printed circuit board and thermally conductive substrate assembly, showing the attachment of the printed circuit board to the thermally conductive substrate.

A side view of the multilayer printed circuit board and thermally conductive substrate assembly is shown in FIG. 4, which shows the two FETs 70 and 72 included in the circuit diagram of FIG. 1, which have been die-attached to the surface of the thermally conductive substrate 42 as shown in FIG. 2. The metallizations on the drain electrode of FETs 70 and 72 have been solder-bonded with solder layers 34 and 35 to the traces 12 and 14 on thermally conductive substrate 42. The concept drawing of FIG. 4 also shows also a support block 66 which forms an attachment point between the multilayer printed circuit board 30 and the thermally conductive substrate 42.

After the FETs are attached to the multilayer PCB, the multilayer circuit board is inverted and attached electrically and mechanically to the thermally conductive substrate below. The high power FETs are therefore sandwiched in between the upper multilayer circuit board 30, and the lower thermally conductive substrate 42, and the thermally conductive substrate 42 exhausts the heat generated by the FETs 70, 72. The thermally conductive substrate 42 may have relieved areas formed therein, in order to surround the bodies of the heat-generating FETs 70, 72.

Figure 5:
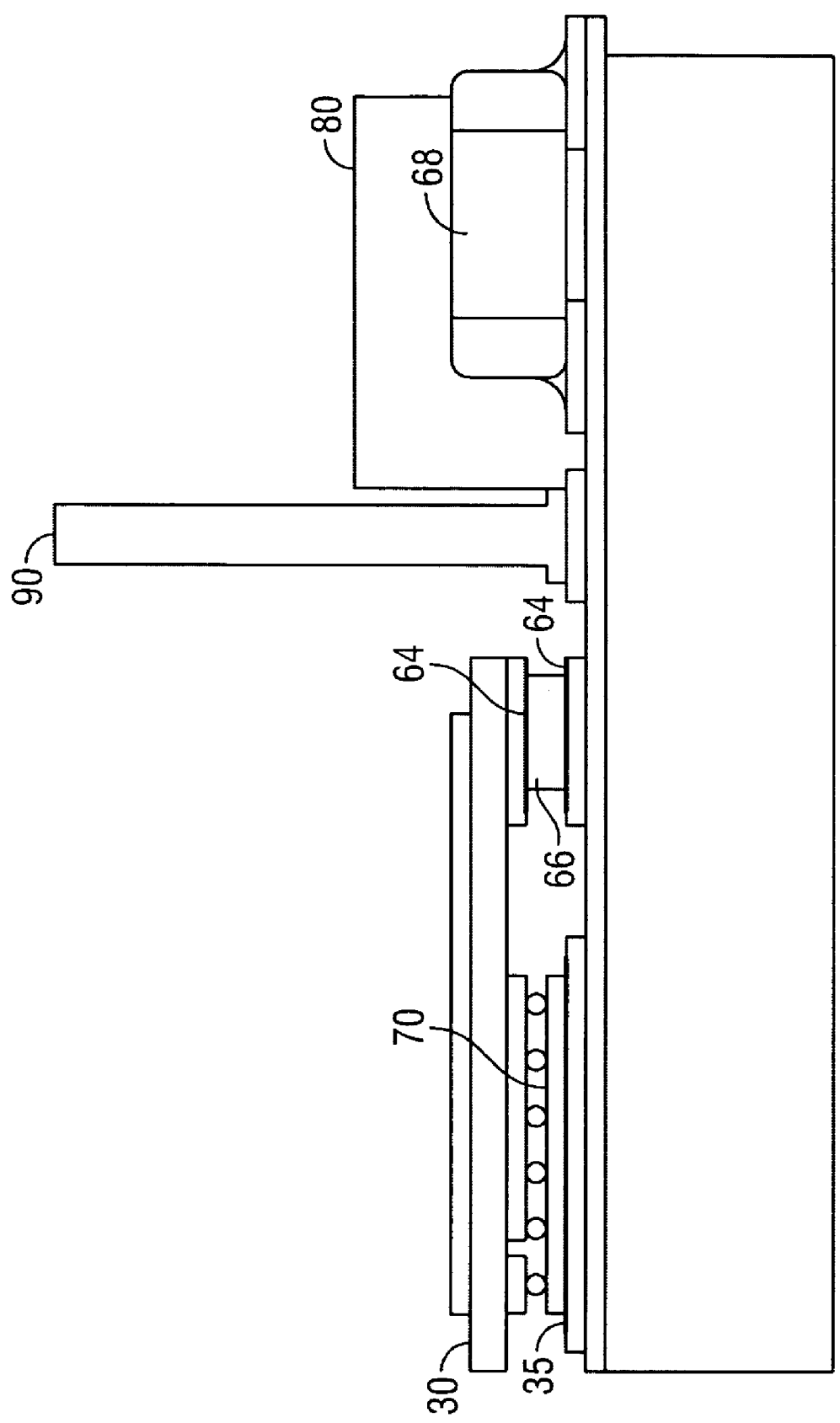
FIG. 5 is an end view of the multilayer printed circuit board and thermally conductive substrate assembly, showing the attachment of the multilayer printed circuit board to the thermally conductive substrate.

The thermally conductive substrate 42 is then attached to the multilayer PCB 30 at one or more interconnect attachment points shown as support blocks 66 in FIG. 4 and FIG. 5, which may or may not be also electrically conducting. The interconnect attachment points may be formed leads, metal blocks, non-conductive blocks, conductive blocks, balls, etc. The support block may be formed, for example, from a solderable metal block made from copper, brass or other metal. It may be plated with, for example, nickel and tin, to improve solderability. Alternatively, the support block may be an electrically insulating block made from ceramic or plastic-like epoxy or polyamide. In this case, the support block is attached using conventional adhesive 64 applied to the top and bottom of the support block 66. The top and bottom surfaces 64 may also be metallized if the block is to be soldered in place instead of using adhesive for attachment. The purpose of the support block is to create a defined separation between the printed circuit board and the thermally conductive substrate, and in some embodiments, to provide electrical interconnection points between the printed circuit board 30 and the thermally conductive substrate 42. The thickness of the support blocks 66 is determined by the configuration of the module.

The laminate of the multilayer PCB 30 is, in some embodiments, thin enough to be somewhat flexible, in order to accommodate the topography of the devices mounted on the lower, thermally conductive substrate 42.

The thickness of the thermally conductive substrate 42 may be, for example, 2.0 mm thick, wherein the thickness is comprised of 250 μm thick conductive traces 12 or 14, a 300 μm thick insulating layer 40, and the remainder is the 1.5 mm thick thermally conductive material 44 such as aluminum, copper or ceramic. The thickness of the solder connections 34, 35 may be about 100 μm to 200 μm, and the thickness of the FET die 70, 72 is about 250 μm. The multilayer PCB thickness 30 may be at least 200 μm to 750 μm, which along with the solder ball connections 31, 32 (100 μm to 200 μm thick) and copper traces 37, 38 (250 μm thick) may contribute an additional 1.2 mm thickness. Therefore, the total thickness of the module may be about 3.2 mm, not including the thickness of any additional surface mount components attached to the top side of the multilayer PCB 30. Such components may add an additional 4–5 mm for a surface-mounted capacitor for example. The largest surface mount components may be inductors which may be 10 mm thick, which would bring the total module thickness to 13.2 mm, still within the 15.24 mm specification tolerance.

Figure 6:
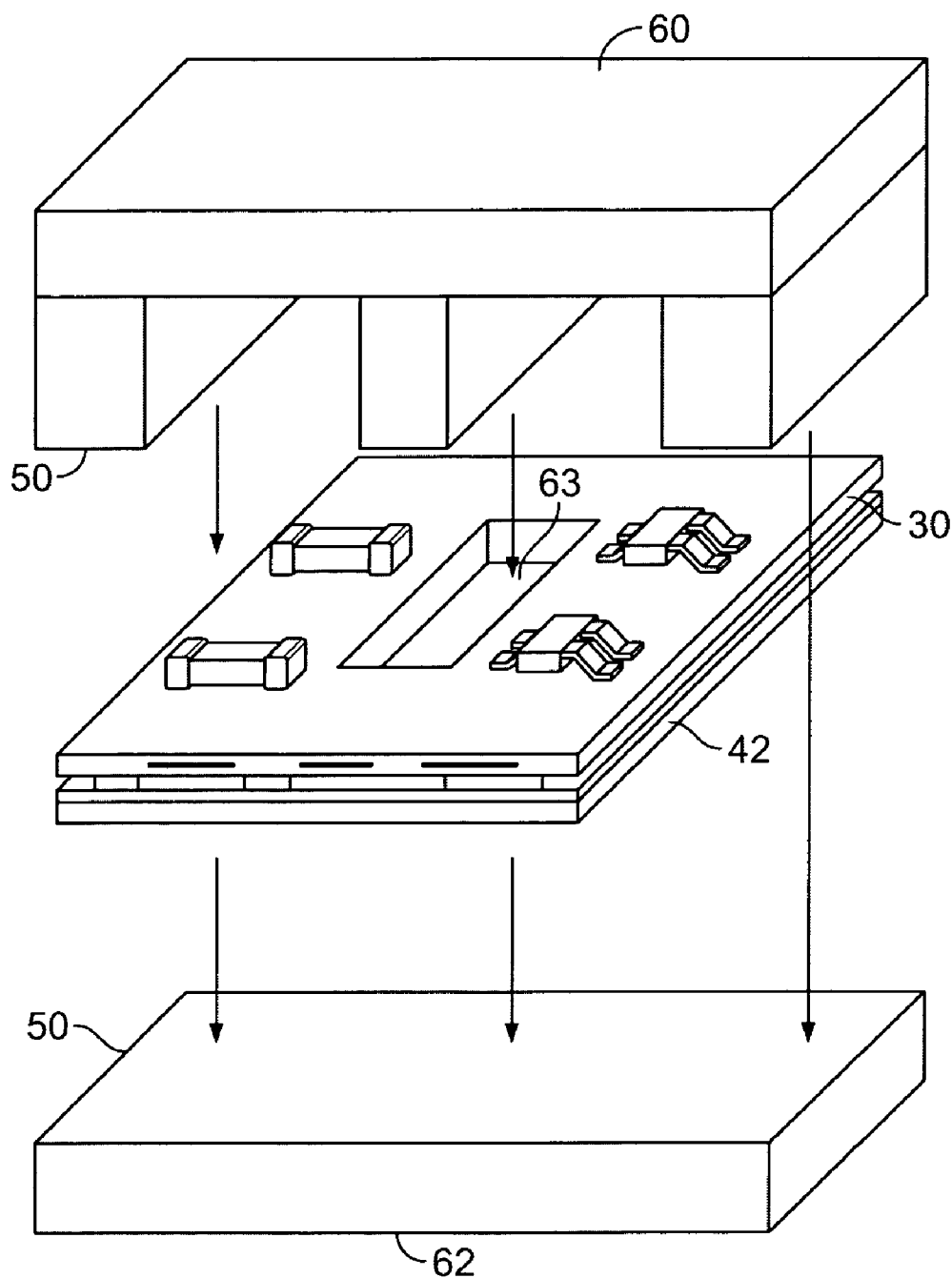
FIG. 6 is an angled view of the multilayer printed circuit board and thermally conductive substrate assembly in relation to an E-shaped core and an I-shaped core.

FIG. 6 depicts an angled view of the multilayer printed circuit board 30 and thermally conductive substrate 42 assembly in relation to a magnetic core element 50 comprising an E-shaped core 60 and an I-shaped core 62. The high interconnect density of the multilayer printed circuit board 30 allows an isolation transformer or inductor to be integrated into the assembly of the present invention. The multilayer printed circuit board 30 contains the primary transformer windings etched within its layers, and the thermally conductive substrate contains a secondary turn or turns. The different laminate layers of the multilayer printed circuit board 30 and the solder mask provide electrical insulation. A magnetic core element 50 completes the transformer or inductor. The magnetic core element may comprise separate E-shaped cores 60 and I-shaped cores 62, as depicted, or, alternately, pairs of E-shaped cores. The multilayer printed circuit board 30 and thermally conductive substrate 42 each further comprise at least one hole 63 to admit one leg of the E-shaped core 60, thereby permitting the leg of the E-shaped core 60 to extend through the hole 63 and contact the I-shaped core 62 to complete a magnetic circuit that encloses the printed circuit board 30 and thermally conductive substrate 42. As known in the art, the magnetic core element 50 provides a path for communication of magnetic flux to facilitate transfer of an electric current from the primary transformer windings to the secondary transformer windings. Depending on circuit density and size, all circuit elements could be completely enclosed within the magnetic core element 50. The placement of circuit elements inside the magnetic core element 50 provides improved EMI shielding and allows increases in assembly density.

The module according to the present invention has a number of advantages over the prior art. By using high thermal mass, low thermal resistance substrate, heat generated by the FETs can be dissipated quickly and over a large surface area. Since the current-carrying leads are also attached to the thermal substrate, the substrate can further dissipate heat generated in the leads. Furthermore, since the adjacent multilayer PCB is held very close to the thermally conductive substrate, the thermally conductive substrate can also assist in dissipating heat generated by devices on the multilayer PCB. Therefore, the heat generated by the devices can be spread out quickly over the surface area of the thermally conductive substrate. Since the thermally conductive substrate comprises a major portion of the structure of the package module, the heat is spread evenly and over a large area, without adding structures which would increase the dimensions of the package.

The differential expansion of the various components with temperature can be mitigated by using adhesives which flex, and thereby take up stress. The materials comprising the thermally conductive substrate may be chosen to match, as closely as practical, the thermal expansion coefficients of the multilayer PCB material. Furthermore, the compact nature of the package reduces the stresses of differential expansion by reducing the largest physical dimension, L. Reducing the physical dimension reduces the stress, so that cycling fatigue of the components is reduced by a factor of approximately $1/L^2$. Failures due to stress-related cracks and wire bond breaks are reduced in the embodiments described above, as wire bonds are avoided or minimized. The invention offers the further advantages of a small number of parts, fewer wire bonds and consequently reduced manufacturing costs.

The invention is not limited to the exemplary embodiments described above. For instance, the invention is not limited to copper or aluminum for the thermally conductive substrate material, nor is it limited to a buck converter circuit or to use with FETs, but can be applied to any circuit needing to deliver high currents to and from its components. In addition to conventional magnetically conductive metallic materials for the transformer and inductor elements, magnetic polymer materials could be utilized to mold inductive elements in any desired shape or configuration. Other embodiments and variations are within the scope of the invention, as defined by the appended claims.

What is claimed is:

1. A power supply package comprising:
   a thermally conductive substrate, electrically coupled to a first current handling terminal on a first surface of a semiconductor die;
   a multilayer printed circuit board, electrically coupled to a second current handling terminal on an opposing surface of the semiconductor die; and
   a magnetic core element;
   wherein the thermally conductive substrate is attached to the multilayer printed circuit board, and wherein the multilayer printed circuit board further comprises primary windings etched within layers of the multilayer printed circuit board and the thermally conductive substrate contains at least one secondary turn, the primary windings and the at least one secondary turn being magnetically coupled by the magnetic core element.

2. The power supply package of claim 1, wherein the multilayer printed circuit board further comprises at least four layers.

3. The power supply package of claim 1, wherein the magnetic core element comprises an E-shaped core having three legs and an I-shaped core and wherein the multilayer printed circuit board and the thermally conductive substrate each comprise at least one hole configured to mate with a corresponding one of said legs of the E-shaped core.

4. The power supply package of claim 1, wherein the magnetic core element comprises a first and second E-shaped core having three legs and wherein the multilayer printed circuit board and the thermally conductive substrate each comprise at least one hole configured to mate with a corresponding one of said legs of the E-shaped core.

5. The power supply package of claim 1, wherein the magnetic core element is comprised of a magnetic polymer material.

* * * * *